United States Patent
Song

(10) Patent No.: US 8,917,570 B2
(45) Date of Patent: Dec. 23, 2014

(54) MEMORY DEVICE AND METHOD FOR OPERATING THE SAME

(71) Applicant: SK hynix Inc., Gyeonggi-do (KR)

(72) Inventor: Choung-Ki Song, Gyeonggi-do (KR)

(73) Assignee: SK Hyinx Inc., Gyeonggi-do (KR)

( * ) Notice: Subject to any disclaimer, the term of this patent is extended or adjusted under 35 U.S.C. 154(b) by 0 days.

(21) Appl. No.: 13/716,806

(22) Filed: Dec. 17, 2012

(65) Prior Publication Data
US 2014/0003183 A1    Jan. 2, 2014

(30) Foreign Application Priority Data
Jun. 28, 2012   (KR) .................. 10-2012-0069880

(51) Int. Cl.
G11C 8/00   (2006.01)
G11C 8/06   (2006.01)

(52) U.S. Cl.
CPC ........................ G11C 8/06 (2013.01)
USPC ................... 365/230.03; 365/230.08

(58) Field of Classification Search
CPC ................... G11C 8/12; G11C 7/18
USPC ........................ 365/230.03, 230.08
See application file for complete search history.

(56) References Cited

U.S. PATENT DOCUMENTS

| | | | |
|---|---|---|---|
| 2007/0070787 A1* | 3/2007 | An | 365/230.08 |
| 2012/0155205 A1* | 6/2012 | Ku | 365/222 |
| 2013/0083617 A1* | 4/2013 | Song | 365/230.02 |

FOREIGN PATENT DOCUMENTS

| | | |
|---|---|---|
| KR | 1020070036644 | 4/2007 |
| KR | 1020100007527 | 1/2010 |

* cited by examiner

*Primary Examiner* — Huan Hoang
(74) *Attorney, Agent, or Firm* — IP & T Group LLP

(57) ABSTRACT

A memory device includes a plurality of banks, a plurality of address buffers configured to receive addresses, and a buffer control unit configured to deactivate one or more of the plurality of address buffers when the number of activated banks among the plurality of banks is a prescribed number.

11 Claims, 4 Drawing Sheets

MEMORY DEVICE AND METHOD FOR OPERATING THE SAME

CROSS-REFERENCE TO RELATED APPLICATIONS

The present application claims priority of Korean Patent Application No. 10-2012-0069880, filed on Jun. 28, 2012, which is incorporated herein by reference in its entirety.

BACKGROUND

1. Field

Exemplary embodiments of the present invention relate to a memory device and a method for operating the same, and, more particularly, to a technology related to an address of a memory device.

2. Description of the Related Art

Basically, a memory device employs a time multiplexed addressing method. In other words, when an address is input together with a row address strobe (RAS) signal, the memory device recognizes the address as a row address and activates a row selected from a plurality of rows in a cell array. Also, when an address is input together with a column address strobe (CAS) signal, the memory device recognizes the address as a column address and accesses data of columns selected from a plurality of columns corresponding to the selected row.

FIG. 1 is a diagram illustrating a part related to the input of an address in a conventional memory device.

Referring to FIG. 1, the memory device includes a command input circuit 110, a command decoder 120, an address input circuit 130, and an address selection unit 140.

The command input circuit 110 receives command signals input from an exterior, latches the input command signals in synchronization with a clock CLK, and provides the latched signals to the command decoder 120. The command signals may include a row address strobe signal RAS, a column address strobe signal CAS, a write enable signal WE, a chip select signal CS, and the like.

The command decoder 120 decodes the command signals received from the command input circuit 110 and generates internal command signals ACT, PCG, RD, and WT. The internal command signals may include an active signal ACT, a precharge signal PCG, a read signal RD, a write signal WT, and the like.

The address input circuit 130 receives multi-bit addresses A<0:N> input from an exterior, latches the input addresses in synchronization with the clock CLK, and provides the latched addresses to the address selection unit 140. The address input circuit 130 includes buffers and latches corresponding to the number of bits of the addresses A<0:N>.

The address selection unit 140 selects addresses ROW_A<0:N> or column addresses COL_A<0:M> to which the addresses received through the address input circuit 130 are provided under the control of the command decoder 120. When a command decoded by the command decoder 120 requires a row address, the address selection unit 140 provides the address received from the address input circuit 130 as the row addresses ROW_A<0:N>. When a command decoded by the command decoder 120 requires a column address, the address selection unit 140 provides the address received from the address input circuit 130 as the column addresses COL_A<0:M>. For example, when the internal command signal activated by the command decoder 120 is the active signal ACT, the address selection unit 140 provides the address received from the address input circuit 130 as the row addresses ROW_A<0:N>. Furthermore, when the internal command signal activated by the command decoder 120 is the read signal RD or the write signal WT, the address selection unit 140 provides the address received from the address input circuit 130 as the column addresses COL_A<0:M>.

In general, the number of bits of the row addresses ROW_A<0:N> used in the memory device is larger than the number of bits of the column addresses COL_A<0:M>. For example, the row addresses ROW_A<0:N> may be 14 bits (N=13) and the column addresses COL_A<0:M> may be 10 bits (M=9). Thus, when the row addresses ROW_A<0: N> are input to the memory device, all the buffers and the latches in the address input circuit 130 need to operate. However, when the column addresses COL_A<0:M> are input to the memory device, all the buffers and the latches in the address input circuit 130 may not need to operate. Since the addresses are applied to the memory device by a memory controller, it may be difficult for the memory device to recognize the time at which an address is applied and the type of the address. Therefore, even when the column addresses are input to the memory device, unnecessary buffers, latches and the like operate, thereby resulting in wasteful current consumption.

SUMMARY

Exemplary embodiments of the present invention are directed to substantially prevent wasteful current consumption when a memory device receives an address.

In accordance with an exemplary embodiment of the present invention, a memory device includes a plurality of banks, a plurality of address buffers configured to receive addresses, and a buffer control unit configured to deactivate one or more of the plurality of address buffers when a number of activated banks among the plurality of banks is a prescribed number. The prescribed number may be substantially equal to a number of the plurality of banks. Column addresses and row addresses are used in the memory device, wherein the number of the address buffers deactivated by the buffer control unit may be obtained by subtracting the number of the column addresses from the number of the row addresses.

In accordance with another exemplary embodiment of the present invention, a memory device includes a plurality of banks; a bank address input circuit; a plurality of address input units; command input circuit; a command decoder configured to decode a command input to the command input circuit; an address selection unit configured to recognize addresses that are input to the plurality of address input units as one of row addresses and column addresses under control of the command decoder; a bank selection unit configured to decode bank addresses input to the bank address input circuit and configured to generate a plurality of bank selection signals corresponding to the plurality of banks; a bank active circuit configured to generate a plurality of bank active signals corresponding to the plurality of banks using an active signal generated by the command decoder, a precharge signal, and the plurality of bank selection signals generated by the bank selection unit; and a buffer control unit configured to deactivate one or more of the plurality of address input units when the number of activated signals among the plurality of bank active signals is a prescribed number. The prescribed number may be substantially equal to the number of the plurality of banks. Column addresses and row addresses are used in the memory device, wherein the number of the plurality of address input units deactivated by the buffer control unit is obtained by subtracting the number of the column addresses from the number of the row addresses.

In accordance with still another exemplary embodiment of the present invention, a method for operating a memory device in which a number of bits of row addresses is different from a number of bits of column addresses includes checking a number of activated memory banks, activating a buffer deactivation signal when the number of activated memory banks checked in the step of checking of the number of activated memory banks is equal to or more than a prescribed number, and deactivating one or more of a plurality of address buffers in response to activation of the buffer deactivation signal.

According to the present invention, a case where column addresses are not likely to be applied to the memory device is determined. When the column addresses are not likely to be applied, a part of a configuration not used to receive the column addresses is deactivated to reduce current consumed in the memory device.

DETAILED DESCRIPTION

Figure 1:
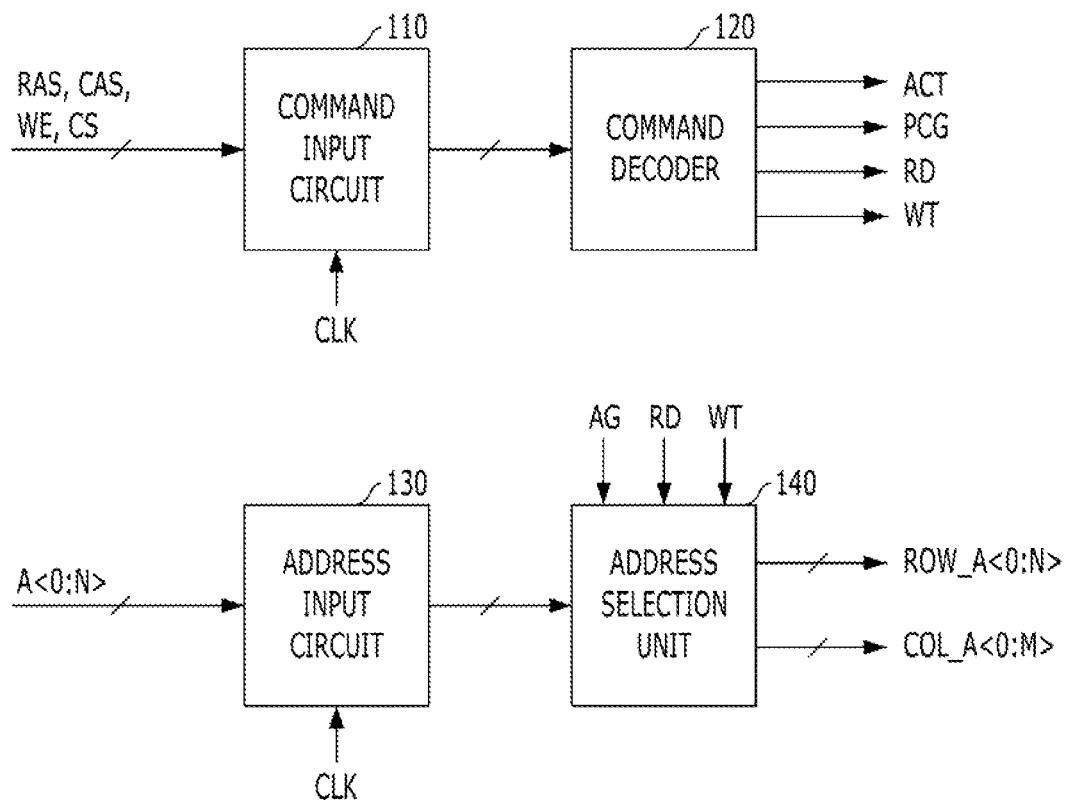
FIG. 1, is a diagram illustrating a part related to the input of an address in a conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, like reference numerals refer to like parts throughout the various figures and embodiments of the present invention.

Figure 2:
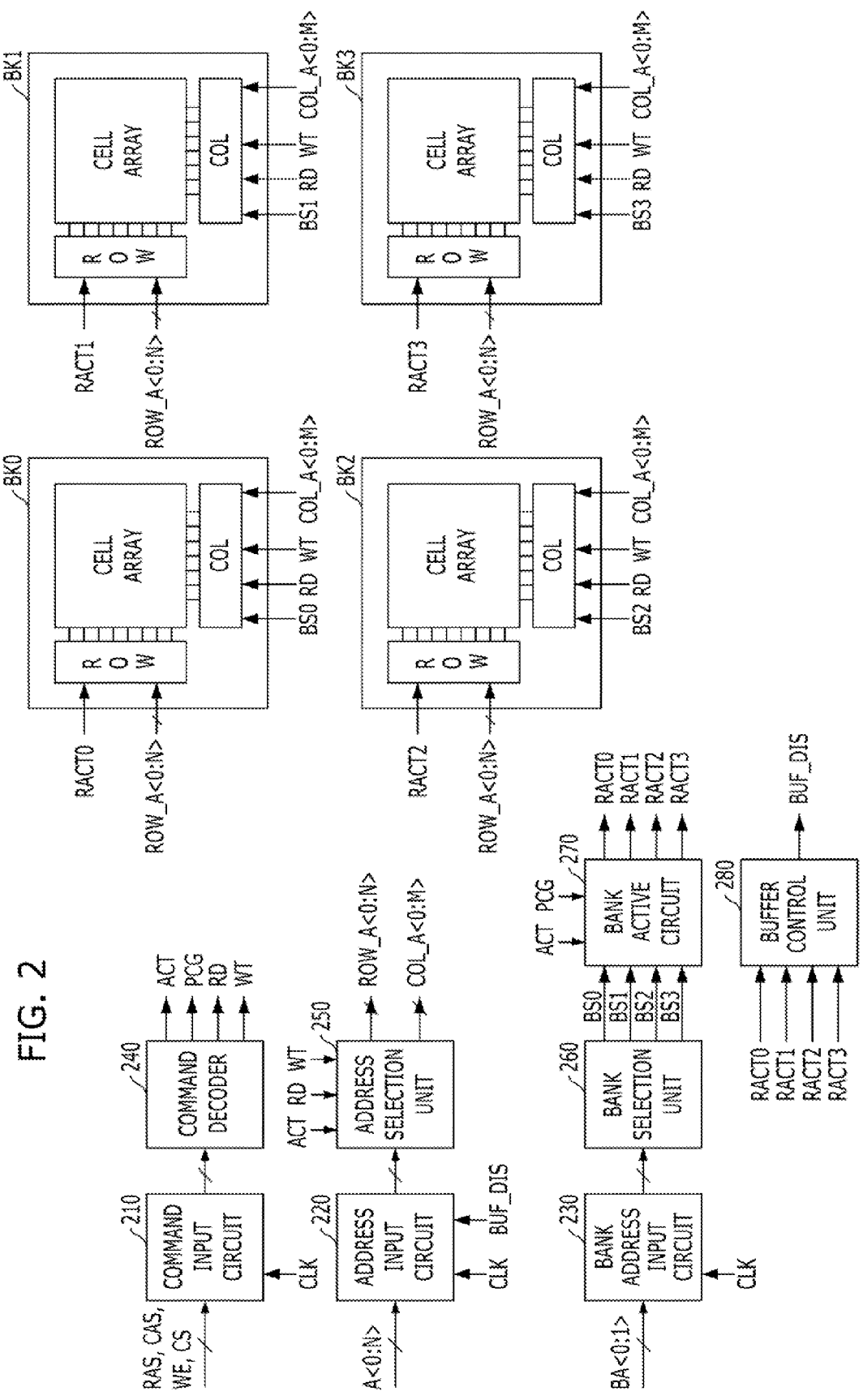
FIG. 2 is a configuration diagram of a memory device in accordance with an embodiment of the present invention.

FIG. 2 is a configuration diagram of a memory device in accordance with an embodiment of the present invention.

Referring to FIG. 2, the memory device includes a plurality of banks BK0 to BK3, a command input circuit 210, an address input circuit 220, a bank address input circuit 230, a command decoder 240, an address selection unit 250, a bank selection unit 260, a bank active circuit 270, and a buffer control unit 280.

Each of the plurality of banks BK0 to BK3 includes a cell array CELL ARRAY, a row circuit ROW, and a column circuit COL. The row circuit ROW is configured to activate one word line selected by row addresses ROW_A<0:N> among a plurality of word lines in the cell array CELL ARRAY for a period in which a signal corresponding to the row circuit ROW among a plurality of bank active signals RACT0 to RACT3 has been activated. In other words, the row circuit ROW selects one row in the cell array CELL ARRAY. The column circuit COL is configured to access data of columns (bit lines) selected by column addresses COL_A<0:M> in the cell array CELL ARRAY when a signal corresponding to the column circuit COL among a plurality of bank selection signals BS0 to BS3 is activated. When a read signal RD is activated, the column circuit COL reads data from selected columns, and, when a write signal WT is activated, the column circuit COL writes data in the selected columns. Since circuits on a data path for transferring data input from an exterior of the memory device to the column circuit COL and outputting data read from the column circuit COL to the exterior of the memory device are not directly related to the present invention, illustration and description thereof will be omitted.

The command input circuit 210 is configured to receive command signals RAS, CAS, WE, and CS input from the exterior of the memory device, to latch the input command signals RAS, CAS, WE, and CS in synchronization with a clock CLK, and to provide the latched signals to the command decoder 240. The command signals may include a row address strobe signal RAS, a column address strobe signal CA a write enable signal WE, a chip select signal CS, and the like.

The command decoder 240 is configured to decode the command signals received from the command input circuit 210 and to generate internal command signals ACT, PCG, RD, and WT. The internal command signals may include an active signal ACT, a precharge signal PCG, a read signal RD, a write signal WT, and the like. The internal command signals generated by the command decoder 240 may further include a MRS signal, a refresh signal and the like. However, since these command signals are not directly related to the present invention, illustration and description thereof will be omitted.

The address input circuit 220 is configured to receive multi-bit addresses A<0:N> input from the exterior of the memory device, to latch the input addresses in synchronization with the clock CLK, and to provide the latched addresses to the address selection unit 250. The address input circuit 220 includes address input units corresponding to the number of bits of the addresses A<0:N>. Among the address input units, M+1 (the number corresponding to the number of bits of column address), address input units receive both the row addresses ROW_A<0:N> and the column addresses COL_A<0:M>. However, (N+1)−(M+1) (the number corresponding to the difference between the number of bits of row address and the number of bits of column address) address input units receive only row addresses ROW_A<M+1:N>. The address input units receiving only the row addresses ROW_A<M+1:N> are deactivated in response to a buffer deactivation signal BUF_DIS, which will be described in more detail with reference to FIG. 5.

The address selection unit 250 is configured to select the row addresses ROW_A<0:N> or the column addresses COL_A<0:M> to which the addresses received through the address input circuit 220 are provided under the control of the command decoder 240. When a command decoded by the command decoder 240 requires a row address, the address selection unit 250 provides the address received from the address input circuit 220 as the row addresses ROW_A<0:N>. When a command decoded by the command decoder 240 requires a column address, the address selection unit 250 provides the address received from the address input circuit 220 as the column addresses COL_A<0:M>. For example, when the internal command signal activated by the command decoder 240 is the active signal ACT, the address selection unit 250 provides the address received from the address input circuit 220 as the row addresses ROW_A<0:N>. Furthermore, when the internal command signal activated by the command decoder 240 is the read signal RD or the write signal WT, the address selection unit 250 provides the address received from the address input circuit 220 as the column addresses COL_A<0:M>.

The bank address input circuit 230 is configured to receive bank addresses BA<0:1> received from the exterior of the memory device, to latch the input bank addresses in synchronization with the clock, and to provide the latched input bank addresses to the bank selection unit 260. The bank address input circuit 230 includes buffers and latches corresponding to the number of bits of the bank addresses BA<0:1>.

The bank selection unit 260 is configured to decode the bank addresses BA<0:1> received from the bank address input circuit 230 and to generate the plurality of bank selection signals BS0 to BS3 corresponding to the plurality of banks BK0 to BK3, respectively. The bank selection unit 260 is configured to activate a bank selection signal selected by the bank addresses BA 0:1> and to deactivate the other bank selection signals. For example, when the bank BK2 is selected, the bank selection signal BS2 is activated to a "high" level, and the other bank selection signals BS0, BS1, and BS3 are deactivated to a "low" level.

The bank active circuit 270 is configured to generate the plurality of bank active signals RACT0 to RACT3 corresponding to the plurality of banks BK0 to BK3 using the active signal ACT, the precharge signal PCG, and the plurality of bank selection signals BS0 to BS3. The bank active circuit 270 is configured to activate a bank active signal corresponding to an activated bank selection signal among the bank selection signals BS0 to BS3 at the time of activation of the active signal ACT. Furthermore, at the time of activation of the precharge signal PCG, the bank active circuit 270 deactivates the bank active signal corresponding to the activated bank selection signal among the bank selection signals BS0 to BS3. For example, when the bank selection signal BS2 and the active signal ACT are activated, the bank active circuit 270 activates the bank active signal RACT2. Then, when the bank selection signal BS and the precharge signal PCG are activated, the bank active circuit 270 deactivates the activated bank active signal RACT2. After the bank active signals RACT0 to RACT3 are once activated, the bank active signals RACT0 to RACT3 may be overlappingly activated because they continuously maintain the activated state until they are deactivated by the precharge signal PCG. In other words, the plurality of banks BK0 to BK3 may be simultaneously activated.

The buffer control unit 280 is configured to generate the buffer deactivation signal BUF_DIS for deactivating one or more of the address input units in the address input circuit 220 when the number of activated signals of the plurality of bank active signals RACT0 to RACT3 is a prescribed number. The prescribed number indicates the number of banks, which may be simultaneously activated in the memory device. In conventional standard specifications of the memory device, all banks may be simultaneously activated. In such a case, the prescribed number is substantially equal to the number of banks. In future standard specifications of the memory device, there may be a regulation for limiting the number of banks that may be activated at a time. For example, when there is a regulation that among 32 banks, 16 banks may be activated at a time, the prescribed number is 16.

The fact that the number of the activated signals of the plurality of bank active signals RACT0 to RACT3 is the prescribed number means that it is impossible to activate the banks BK0 to BK3 and that the row addresses ROW_A<0:N> are not likely to be input. In other words, when the number of the activated signals of the plurality of bank active signals RACT0 to RACT3 is the prescribed number, only the column addresses COL_A<0:M> may be input to the memory device. When the row addresses ROW_A<0:N> are not likely to be input or the number of activated banks is the prescribed number, the buffer control unit 280 activates the buffer deactivation signal BUF_DIS to deactivate a partial configuration of the address input circuit 220 thereby substantially preventing wasteful current consumption.

The present invention determines whether the row addresses ROW_A<0:N> are likely to be input to the memory device, and, when it is determined that the row addresses ROW_A<0:N> are not likely to be input to the memory device, elements of the address input circuit 220 for not receiving the column addresses COL_A<0:M> and for receiving only the row addresses ROW_A<0:N> are deactivated. Consequently, according to the present invention, it is possible to substantially prevent wasteful current consumption in the memory device.

Figure 3:
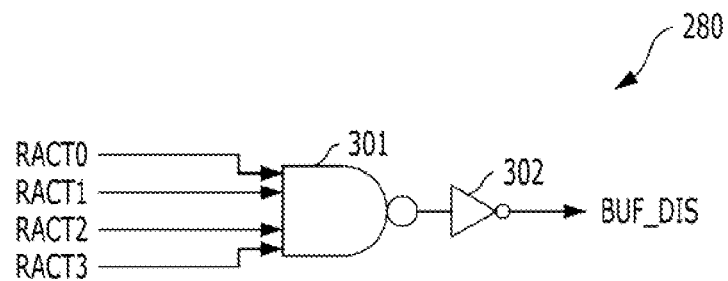
FIG. 3 is a configuration diagram of a buffer control unit 280 of FIG. 2 in accordance with an embodiment of the present invention.

FIG. 3 is a configuration diagram of the buffer control unit 280 of FIG. 2 in accordance with an embodiment.

With reference to FIG. 3, when the prescribed number is substantially equal to the number of all banks, the configuration of the buffer control unit 280 will be described.

As illustrated in FIG. 3, the buffer control unit 280 includes a NAND gate 301 and an inverter 302. Only when all the bank active signals RACT0 to RACT3 input to the NAND gate 301 are activated, the buffer deactivation signal BUF_DIS output from the inverter 302 is activated to a "high" level.

Figure 4:
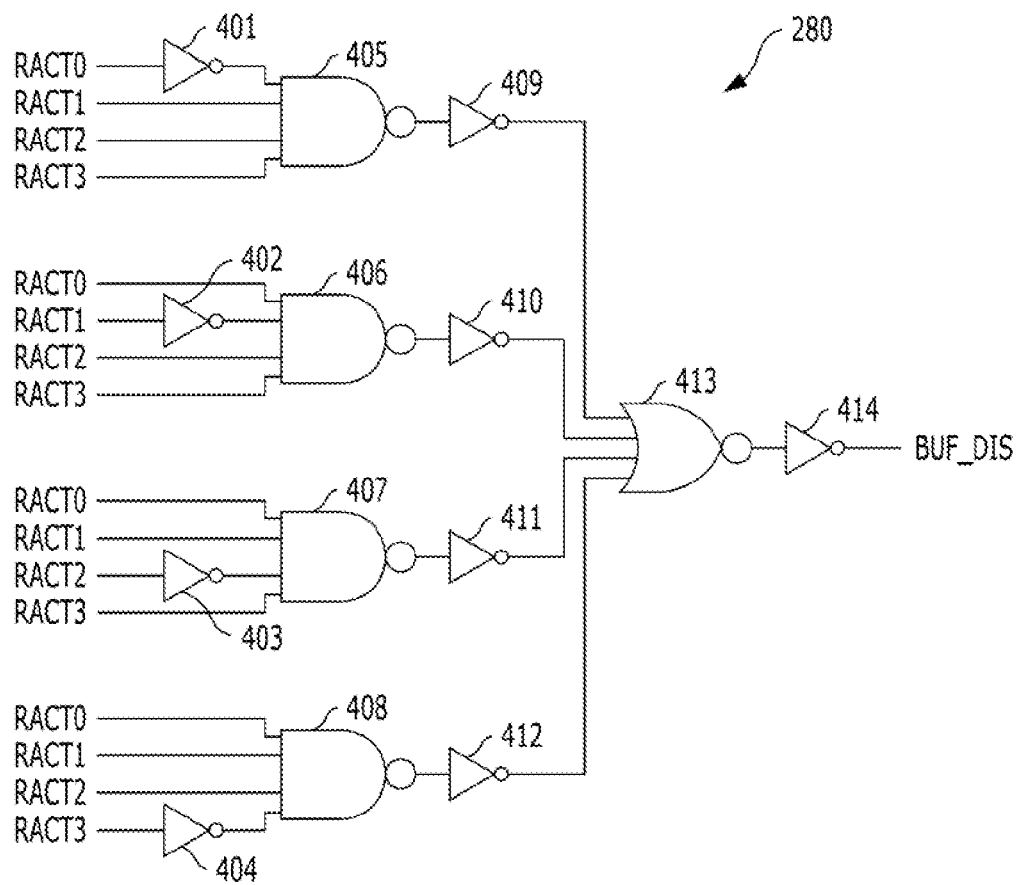
FIG. 4 is a configuration diagram of a buffer control unit 280 of FIG. 2 in accordance with another embodiment of the present invention.

FIG. 4 is a configuration diagram of the buffer control unit 280 of FIG. 2 in accordance with another embodiment.

With reference to FIG. 4, when the prescribed number is 3, the configuration of the buffer control unit 280 will be described.

As illustrated in FIG. 4, the buffer control unit 280 includes inverters 401 to 404, 409 to 412, and 414, NAND gates 405 to 408 and a NOR gate 413. According to the operation of the buffer control unit 280, when three of the bank active signals are activated, the buffer control unit 280 activates the buffer deactivation signal to a "high" level.

In FIG. 3 and FIG. 4, the embodiments of the buffer control unit when the prescribed number is 4 and 3 have been described. However, the buffer control unit 280 can be variously designed according to the number of all banks and the prescribed number in the memory device.

Figure 5:
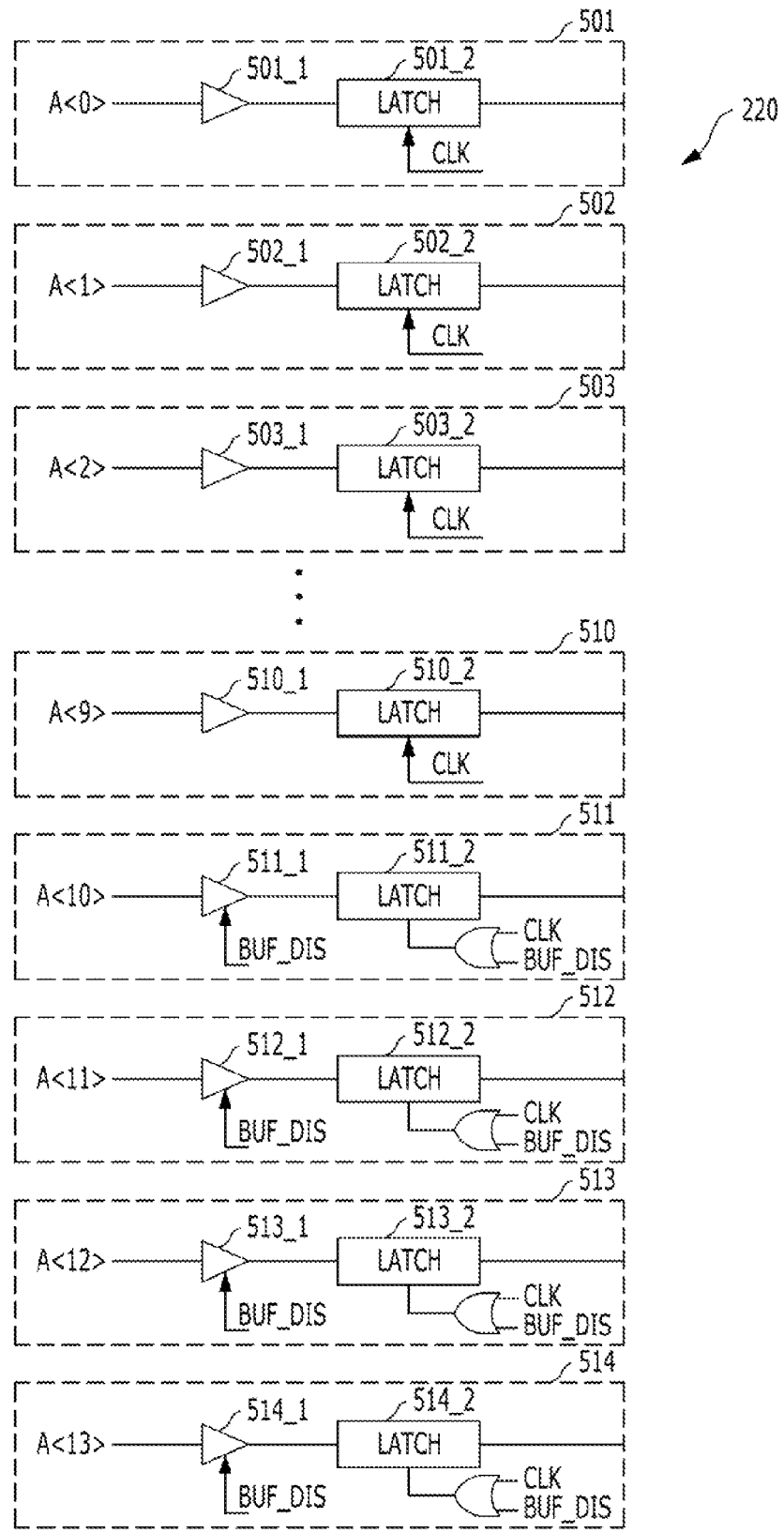
FIG. 5 is a configuration diagram of an address input circuit 220 of FIG. 2 in accordance with an embodiment of the present invention.

FIG. 5 is a configuration diagram of the address input circuit 220 of FIG. 2 in accordance with an embodiment.

For the purpose of convenience, it is assumed that the number of bits of the row addresses ROW_A<0:N> input to the memory device is 14 bits (N=13) and the number of bits of the column addresses COL_A<0:M> is 10 bits (M=9).

Referring to FIG. 5, the address input circuit 220 includes 14 address input units 501 to 514. The address input units 501 to 514 include buffers 501_1 to 514_1 and latches 501_2 to 514_2, respectively.

Among the address input units 501 to 514, the address input units 511 to 514 receiving only row addresses ROW_A<10:10> are deactivated by the buffer deactivation signal BUF_DIS. When the buffer deactivation signal BUF_DIS is activated, the buffers 511_1 to 514_1 are deactivated and the latches 511_2 to 514_2 are also deactivated. The buffers 511_1 to 514_1 are generally prepared in the form of a differential amplifier and may be deactivated by interrupting current sunk from the differential amplifier or current sourced to the differential amplifier. The latches 511_2 to 514_2 may be deactivated by deactivating a clock CLK input to the latches 511_2 to 514_2.

With reference again to FIG. 2 to FIG. 5, an operation method of the memory device, in which the number of the row addresses is different from the number of bits of the column addresses in accordance with the present invention, will be described.

The buffer control unit 280 checks the number of activated memory banks. The number of the activated memory banks may be obtained by checking the number of activated bank active signals RACT0 to RACT3. When the number of the activated memory banks is a prescribed number, the buffer control unit 280 activates the buffer deactivation signal BUF_DIS. Then, in response to the activation of the buffer deactivation signal BUF_DIS, 511_1 to 514_1 of the buffers 501_1 to 514_1 are deactivated. Furthermore, in response to the activation of the buffer deactivation signal BUF_DIS, the latches 511_2 to 514_2 may also be deactivated.

While the present invention has been described with respect to the specific embodiments, it will be apparent to those skilled in the art that various changes and modifications may be made without departing from the spirit and scope of the invention as defined in the following claims.

Particularly, the number of banks provided in the memory device and the prescribed number of banks, which can be simultaneously activated, can be changed according to a change in the standard specifications of the memory device.

What is claimed is:

1. A memory device comprising:
   a plurality of banks;
   a plurality of address buffers configured to receive addresses; and
   a buffer control unit configured to deactivate one or more of the plurality of address buffers if a number of activated banks among the plurality of banks is a prescribed number,
   wherein, a number of the address buffers deactivated by the buffer control unit is obtained by subtracting a number of column addresses from a number of row addresses, the column addresses and the row addresses being used in the memory device.

2. The memory device of claim 1, wherein the prescribed number is substantially equal to the number of the plurality of banks.

3. The memory device of claim 1, further comprising:
   a plurality of address latches configured to be provided to the plurality of address buffers and to latch addresses input to the plurality of address buffers,
   wherein when the one or more address buffers are deactivated by the buffer control unit, address latches corresponding to deactivated address buffers are deactivated.

4. A memory device comprising:
   a plurality of banks;
   a bank address input circuit;
   a plurality of address input units;
   a command input circuit;
   a command decoder configured to decode a command input to the command input circuit;
   an address selection unit configured to recognize addresses that are input to the plurality of address input units, as one of row addresses and column addresses under control of the command decode;
   a bank selection unit configured to decode bank addresses input to the bank address input circuit and configured to generate a plurality of bank selection signals corresponding to the plurality of banks;
   a bank active circuit configured to generate a plurality of bank active signals corresponding to the plurality of banks using an active signal generated by the command decoder, a precharge signal, and the plurality of bank selection signals generated by the bank selection unit; and
   a buffer control unit configured to deactivate one or more of the plurality of address input units when a number of activated signals among the plurality of bank active signals is a prescribed number.

5. The memory device of claim 4, wherein the prescribed number is substantially equal to a number of the plurality of banks.

6. The memory device of claim 4, wherein, a number of the plurality of address input units deactivated by the buffer control unit is obtained by subtracting a number of the column addresses from a number of the row addresses, the column addresses and the row addresses being used in the memory device.

7. The memory device of claim 4, wherein each of the plurality of address input units comprises:
   a buffer; and
   a latch configured to latch addresses input through the buffer in synchronization with a clock.

8. The memory device of claim 7, wherein the buffer control unit is configured to deactivate a buffer in one or more of the plurality of address input units activated by the buffer control unit.

9. The memory device of claim 7, wherein the buffer control unit is configured to deactivate a buffer and a latch in one or more of the plurality of address input units activated by the buffer control unit.

10. A method for operating a memory device in which a number of bits of row addresses is different from a number of bits of column addresses, comprising:
    checking a number of activated memory banks;
    activating a buffer deactivation signal when the number of activated memory banks checked in the checking of the number of activated memory banks is equal to or more than a prescribed number; and
    deactivating one or more of a plurality of address buffers in response to activation of the buffer deactivation signal,
    wherein a number of address buffers deactivated in the deactivating of one or more of the plurality of address buffers is obtained by subtracting a number of the column addresses from a number of the row addresses.

11. The method of claim 10, wherein the prescribed number is substantially equal to a number of all memory banks in the memory device.

* * * * *